US010891996B1

(12) United States Patent
Purohit et al.

(10) Patent No.: US 10,891,996 B1
(45) Date of Patent: Jan. 12, 2021

(54) SIGNAL RECEIVER WITH SKEW-TOLERANT STROBE GATING

(71) Applicant: Rambus Inc., Sunnyvale, CA (US)

(72) Inventors: Neeraj Purohit, Bangalore (IN); Navin Kumar Mishra, Bangalore (IN); Anirudha Shelke, Bangalore (IN)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 16/800,215

(22) Filed: Feb. 25, 2020

Related U.S. Application Data

(63) Continuation of application No. 16/418,204, filed on May 21, 2019, now Pat. No. 10,593,385, which is a continuation of application No. 15/945,235, filed on Apr. 4, 2018, now Pat. No. 10,325,636.

(60) Provisional application No. 62/492,408, filed on May 1, 2017.

(51) Int. Cl.
 *G11C 7/22* (2006.01)
 *H03K 5/135* (2006.01)
 *G11C 7/10* (2006.01)

(52) U.S. Cl.
 CPC ............ *G11C 7/222* (2013.01); *G11C 7/1009* (2013.01); *H03K 5/135* (2013.01)

(58) Field of Classification Search
 None
 See application file for complete search history.

(56) References Cited

U.S. PATENT DOCUMENTS

| 6,570,944 | B2 | 5/2003 | Best et al. |
| 6,930,932 | B2 | 8/2005 | Rentschler |
| 6,940,768 | B2 | 9/2005 | Dahlberg et al. |
| 7,031,205 | B2 | 4/2006 | Han et al. |
| 7,171,321 | B2 | 1/2007 | Best |
| 7,198,197 | B2 | 4/2007 | Best |
| 7,543,172 | B2 | 6/2009 | Kizer et al. |
| 7,688,672 | B2 | 3/2010 | Best et al. |
| 7,898,878 | B2 | 3/2011 | Nguyen et al. |
| 7,948,812 | B2 | 5/2011 | Ware |
| 8,159,887 | B2 | 4/2012 | Kizer et al. |
| 8,243,484 | B2 | 8/2012 | Kizer et al. |
| 8,352,696 | B2 | 1/2013 | Hampel |
| 8,504,788 | B2 | 8/2013 | Stott et al. |
| 8,630,131 | B1 | 1/2014 | Shiao et al. |
| 8,824,224 | B2 | 9/2014 | Ware et al. |
| 8,868,873 | B2 | 10/2014 | Shaeffer et al. |
| 9,324,409 | B1 | 4/2016 | Magee et al. |
| 9,368,172 | B2 | 6/2016 | Palmer et al. |
| 9,390,777 | B2 | 7/2016 | Kizer et al. |
| 9,432,179 | B2 | 8/2016 | Stott et al. |
| 9,514,420 | B2 | 12/2016 | Bose et al. |
| 9,679,633 | B2 | 6/2017 | Maryan et al. |
| 9,843,315 | B2 | 12/2017 | Ware |
| 9,892,771 | B2 | 2/2018 | Palmer et al. |
| 2014/0226420 | A1 | 8/2014 | Best |
| 2014/0269117 | A1 | 9/2014 | Maryan et al. |

*Primary Examiner* — Jeffery S Zweizig
(74) *Attorney, Agent, or Firm* — Charles Shemwell

(57) ABSTRACT

A gating signal for masking overhead transitions in a data-strobe signal is generated adaptively based on timing events in the incoming data-strobe signal itself to yield a gating window that opens and closes deterministically with respect to active edges of the data-strobe signal.

20 Claims, 5 Drawing Sheets

FIG. 8
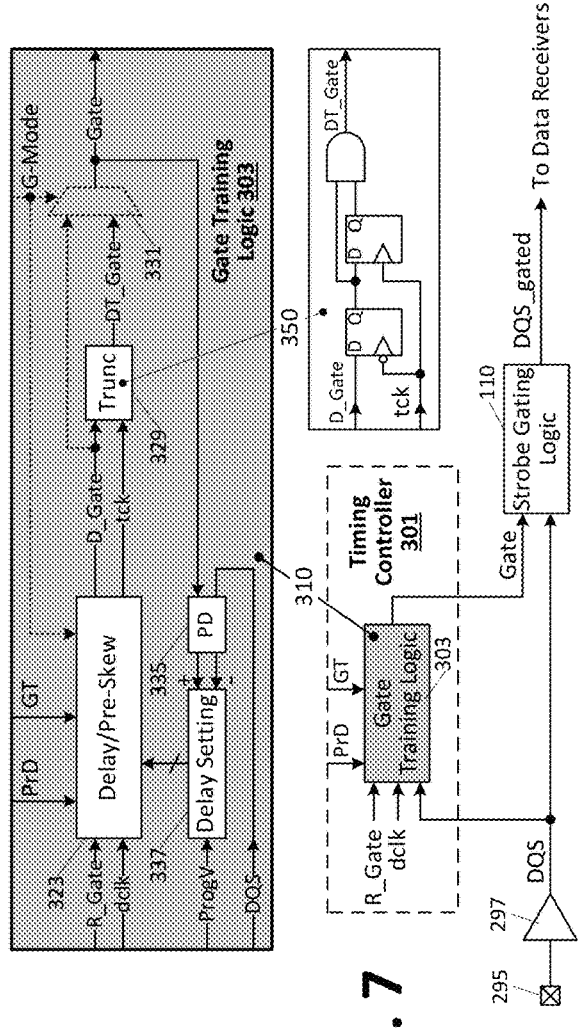
FIG. 7
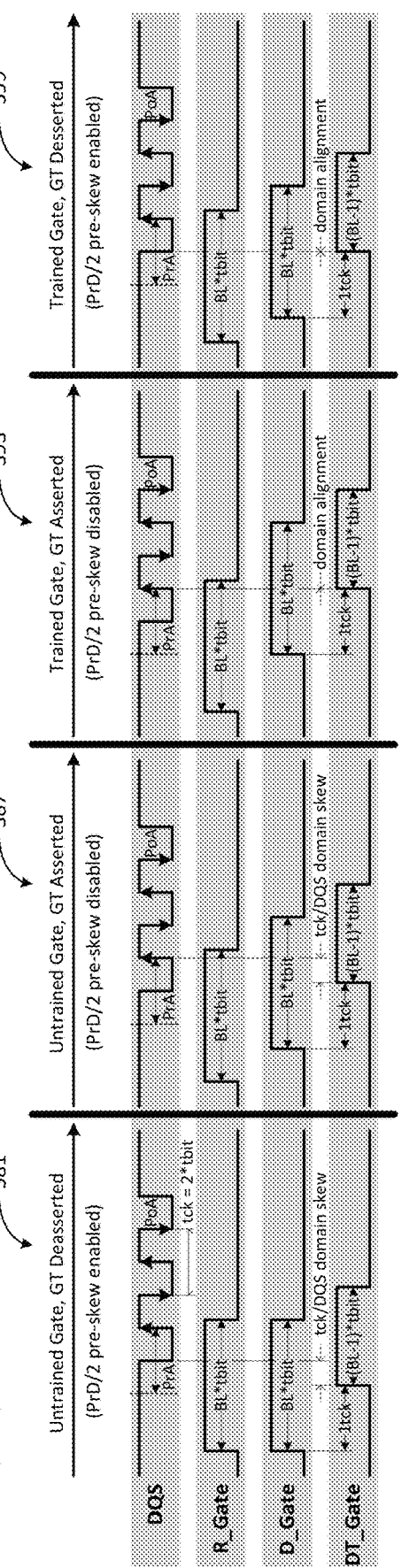
FIG. 9

SIGNAL RECEIVER WITH SKEW-TOLERANT STROBE GATING

CROSS REFERENCE TO RELATED APPLICATIONS

This application is a continuation of U.S. patent application Ser. No. 16/418,204 filed May 21, 2019 (now U.S. Pat. No. 10,593,385), which is a continuation of U.S. patent application Ser. No. 15/945,235 filed Apr. 4, 2018 (now U.S. Pat. No. 10,325,636), which claims the benefit of U.S. Provisional Application No. 62/492,408 filed May 1, 2017. Each of the foregoing applications is hereby incorporated by reference.

TECHNICAL FIELD

The present disclosure relates to the field of chip-to-chip signaling; signaling between integrated circuit devices.

BACKGROUND

In strobe-timed signaling systems, "active" strobe edges that mark data sampling instants are preceded and succeeded by characteristic strobe preamble and postamble waveforms having idle-to-ready transitions and vice-versa—overhead transitions that are gated-out of the timing signal supplied to trigger signaling sampling operations within link receivers. The interval between preamble transition and the first active strobe edge (and/or final active strobe edge and postamble transition) may be as brief as a bit-time, allowing scant margin of error within the receiver-generated gating signal used to suppress overhead (non-active) strobe edges. In the face of ever-present demand for increased signaling bandwidth, gating signal timing margins are approaching limits imposed by chip-to-chip timing drift, reference clock jitter and other timing skew sources, threatening to impede further bit time reduction/bandwidth gain.

DRAWINGS

The various embodiments disclosed herein are illustrated by way of example, and not by way of limitation, in the figures of the accompanying drawings and in which like reference numerals refer to similar elements and in which:

FIG. 1 illustrates a generalized embodiment of a chip-to-chip signaling system in which an integrated-circuit memory control component implements skew-tolerant strobe gating to receive strobe-timed data signals from an integrated-circuit memory component;

FIG. 2 contrasts direct and adaptive gating modes within the multi-modal strobe gating logic of FIG. 1;

Figure 3:
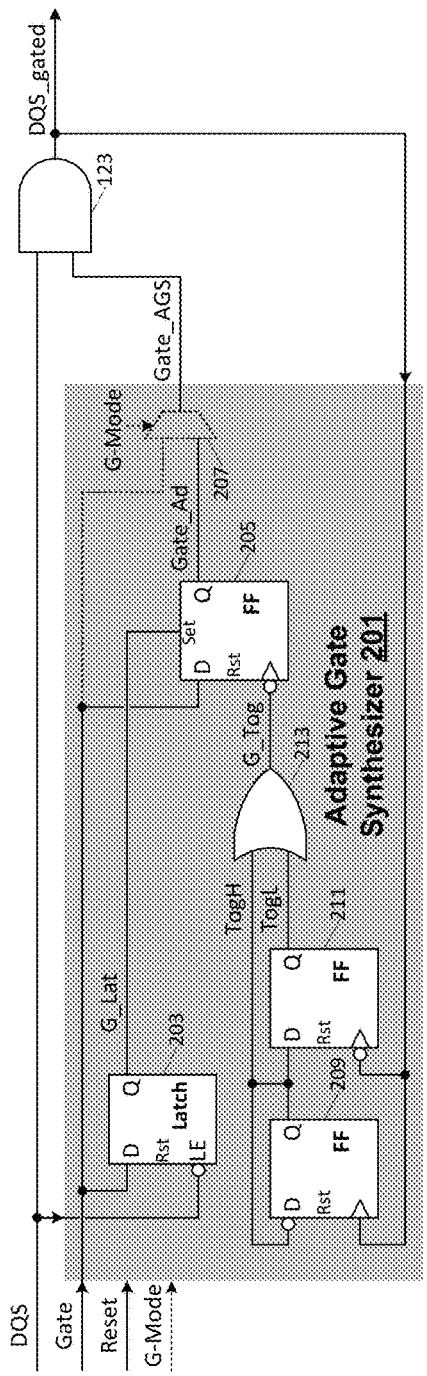
FIG. 3 illustrates a more detailed embodiment of an adaptive gate synthesizer.
Figure 5:
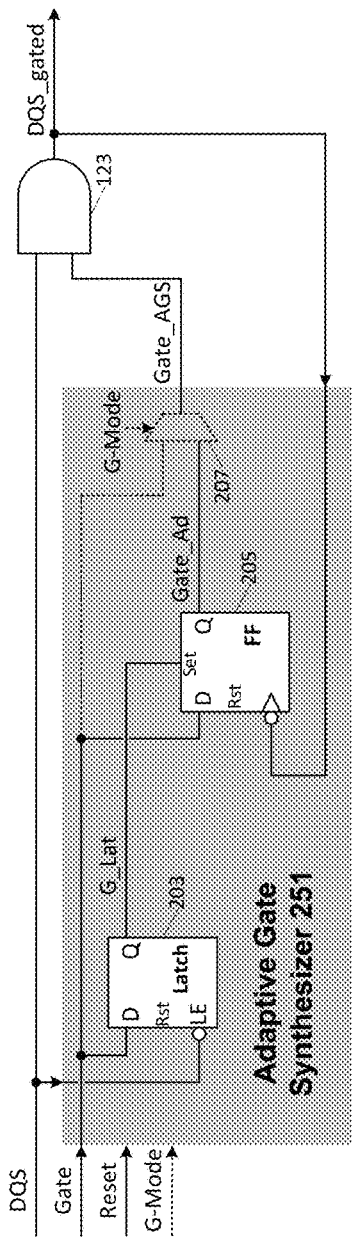
Figure 6B:
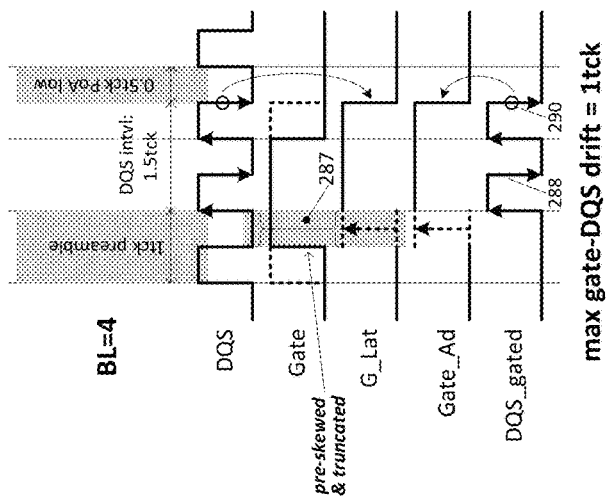
Figure 6A:
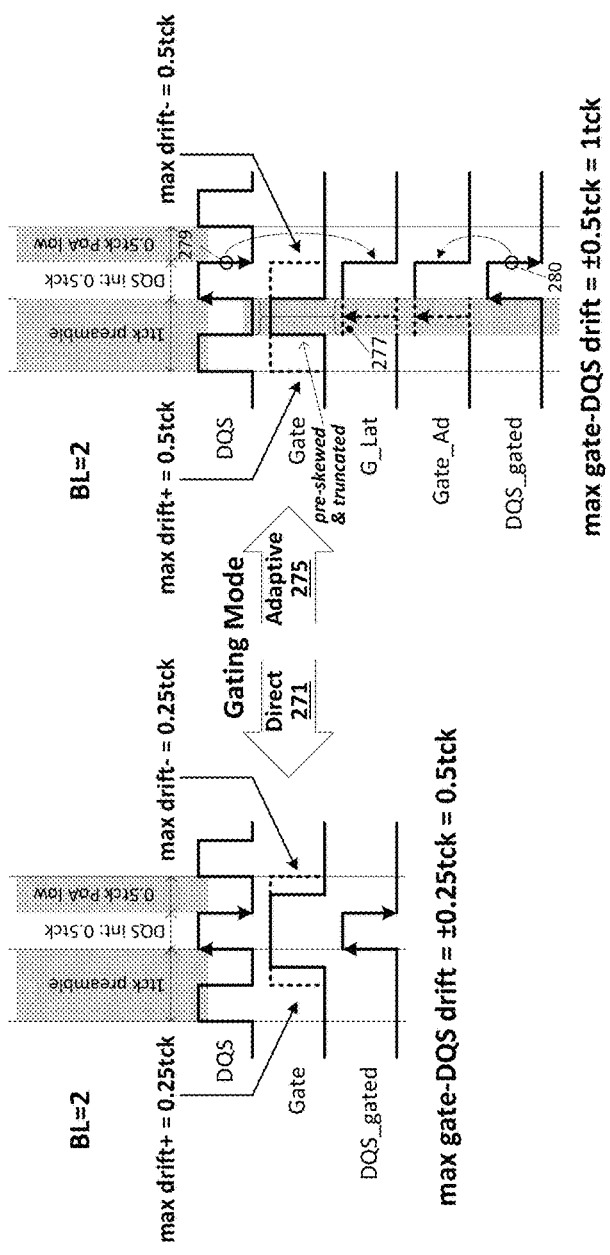
Figure 10:
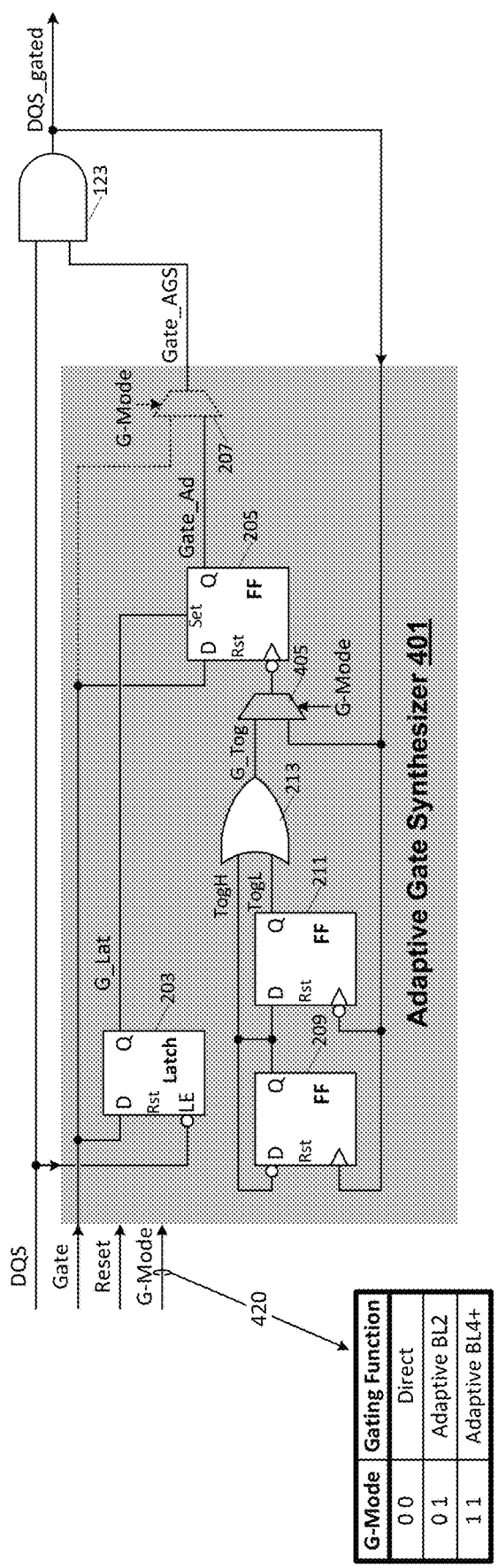

FIG. 5 an alternative adaptive gate synthesizer embodiment that supports burst lengths less than four bits (e.g., two bit burst lengths or BL=2);

FIG. 6A contrasts direct and adaptive gating modes within the gate synthesizer circuit of FIG. 5;

FIG. 6B illustrates an exemplary adaptive-gating-mode operation of the FIG. 5 adaptive gate synthesizer with a 4-bit burst length;

FIGS. 7 and 8 illustrate an embodiment of a gate training circuit and exemplary gate-training sequence that may be used to achieve the initial input-gate phase in the direct and adaptive gating modes discussed in reference to FIGS. 1-6B;

FIG. 9 illustrates an exemplary timing diagram corresponding to the gate-training sequence shown in FIG. 8;

FIG. 10 illustrates an alternative gate synthesizer circuit embodiment that may be programmably configured to implement either of the adaptive gate synthesizer configurations shown in FIGS. 3 and 5.

DETAILED DESCRIPTION

In various embodiments disclosed herein, a strobe gating signal is generated adaptively based on timing events in the incoming strobe signal itself to yield a gating window that opens and closes deterministically with respect to active edges of the strobe signal. In a number of embodiments, for example, an adaptive strobe-gate signal is asserted upon detecting the preamble-ready-state of the strobe signal that precedes the first active strobe edge and then deasserted in response to the final active strobe edge, thus effecting a gating window that drifts—relative to the receive-side timing domain—with the strobe signal itself. As the adaptive-gate signal is generated within the receive-side timing domain, the net effect of the drifting/adaptive gating window is to expand the tolerable drift between the incoming DQS signal (and thus the remote timing domain from which the DQS is sourced) and the receive-side timing domain—in a number of cases, a skew tolerance improvement by one or more bit times (e.g., a 400% skew tolerance improvement in one embodiment). Various other embodiments discussed below accommodate a variety of system-specific burst lengths and/or ranges of burst lengths, strobe characteristics (e.g., toggling vs. non-toggling, preamble duration, etc.), and operating modes (e.g., skew-tolerant vs. low-power operating modes).

Figure 1:
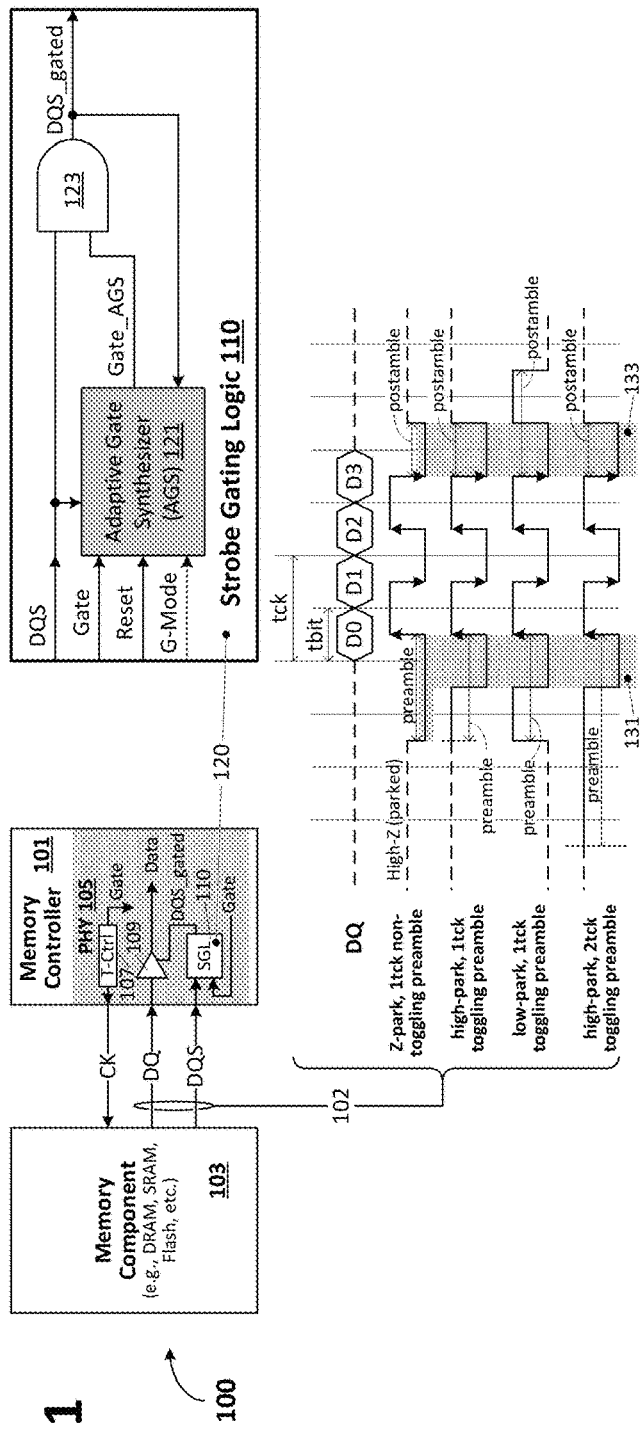

FIG. 1 illustrates a generalized embodiment of a chip-to-chip signaling system 100 in which an integrated-circuit (IC) memory control component 101 implements skew-tolerant strobe gating to receive strobe-timed data signals from an integrated-circuit memory component 103. In the particular example shown, control component 101 generates a system clock signal which establishes a controller timing domain and which is forwarded to the memory component via clock link (CK) to establish a timing reference therein. The memory component (e.g., DRAM, SRAM, Flash Memory or any other practicable data storage IC) receives command/address information from controller component via one or more command/address links (not shown) and, in response to memory read commands at least, transmits data (e.g., "read data") to the controller component via one or more data links (DQ) and an accompanying strobe signal via strobe link (DQS). To simplify discussion of strobe-to-data timing relationships, a single DQ/DQS link pair is shown, though numerous DQ links may be present, with a separate DQS link for every N DQ links (where N=1, 2, 4, 8, or any other practicable number). More generally, though skew-tolerant strobe-timed signaling is described in the context of a memory system/memory subsystem, the techniques and embodiments presented herein may be implemented in any strobe-timed chip-to-chip signaling arrangement.

Still referring to FIG. 1, controller component 101 includes, as part of a physical signaling interface 105 (PHY), timing control logic 107 together with a synchronous signal receiver 109 and strobe gating logic 110. Timing control logic 107 generates the system clock signal conveyed on clock link CK as well corresponding internal clock signals and a gating signal (Gate) that, depending on the operating mode selected within the strobe gating logic 110, either (i) directly defines a strobe gating window within the controller PHY having a fixed duration and phase relation to the outgoing system clock (direct strobe-gating mode), or (ii) enables definition of an adaptive strobe gating window having a duration and phase (of at least one edge) that varies in accordance with skew between the system clock and the incoming strobe signal (adaptive strobe-gating mode). In either gating mode, strobe-gating logic 110 outputs a gated strobe signal "DQS_gated"—a timing signal from which preamble/postamble transitions have been removed or suppressed—to time data sampling operations within receiver 109.

Detail view 120 of FIG. 1 illustrates an embodiment of strobe-gating logic 110 having a logic AND gate 123 and an adaptive gate synthesizer circuit 121, the latter being referred to for brevity herein as a "gate synthesizer" or "synthesizer" circuit. As shown, gate synthesizer 121 receives the incoming strobe signal (referred to occasionally herein as "DQS"—the same name as the strobe signaling link over which it is conveyed), the gating signal "Gate" supplied by timing controller 107, as well as a reset signal (e.g., asserted during system initialization and as needed thereafter) and an optional gating-mode signal, "G-Mode." Gate synthesizer 121 responds to these inputs by outputting a final gating signal, Gate_AGS, that is logically ANDed with the incoming DQS signal in logic gate 123 to produce the aforementioned gated DQS signal (DQS_gated) from which overhead transitions within the DQS preamble and postamble are "gated out" (i.e., suppressed, removed or otherwise eliminated). Where both direct and adaptive gating modes are supported within strobe gating logic 110, the gating-mode signal is provided to select a corresponding direct-gating or adaptive-gating output within gate synthesizer 121, the former implemented, for example, by multiplexing the input gate signal (Gate) directly to the gate synthesizer output and the latter by synthesizing an adaptive gate signal based on the input gate signal and the incoming DQS itself.

Before explaining gate synthesizer operation in greater detail, it is instructive to consider characteristic waveforms conveyed via the DQ and DQS signaling links. Referring to detail view 102, for example, the data waveform generated by memory component 103 conveys data symbols during respective "symbol times" that transpire back-to-back in a finite sequence referred to herein as a burst (or data burst). In the implementation shown, each transmitted symbol conveys a single bit of information (the simplest case) so that the corresponding symbol time is a bit interval or bit time, shown as "tbit." Also, double-data-rate (DDR) signaling is assumed in which two bits are conveyed synchronously with respect to each cycle of the strobe signal—one bit in synchrony with a rising strobe edge and one bit in synchrony with the preceding or ensuing falling strobe edge. Further, the strobe signal output from the memory component is assumed to be mesochronous with respect to the system clock signal (i.e., same frequency but arbitrary phase offset as the strobe is generated within a memory component circuit that is clocked by the system clock but imparts a time-varying/time-drifting delay that contributes to the strobe-to-clock phase drift) so that the strobe cycle time matches the clock cycle time "tck" and thus that tck=2*tbit (where '*' denotes multiplication). Although these assumptions are carried forward in the embodiments described below, in all cases individual symbol transmissions may convey more than one bit, the number of symbols conveyed per tck interval may be more than two (e.g., quad data rate or higher) or less than two (e.g., single data rate) and/or the strobe signal and system clock signal may have a non-unity frequency ratio.

Still referring to detail view 102 of FIG. 1, four different data strobe waveforms are depicted in conjunction with a 4-bit DDR data burst (i.e., single-bit per symbol with burst length=4). As shown, each of the data strobes includes sequence of active edges (i.e., low-to-high or high-to-low transitions marked by respective arrows) sandwiched between preamble and postamble waveforms and aligned with respective data-eye midpoints (nominally the temporal centers of the data eyes). The postambles are generally the same duration of 0.5-tck or 1-tck in the examples shown, but conclude/idle at different signal levels (i.e., either a parked high-impedance state, high logic state or low logic state), while the preambles have various different durations (1 tck or 2 tck) and commence from different signal levels (again, either a parked high-impedance state or a high logic state). In all cases, the preamble is characterized by a transition from either a logic-high state or high-impedance state to a low "ready state" (shaded region 131) that precedes the first active (rising) strobe edge. Similarly, all four data strobe waveforms conclude with a low initial postamble state (shaded region 133) having a duration of at least 0.3 tck (0.5 tck postambles are shown) before returning to parked states (i.e., transitioning directly to a logic-high or high-impedance parked state, or, in the case of the low-park waveform, transitioning to a postamble high state before returning to a logic-low parked state). Also, while a quadrature strobe-data phase relationship is shown, the strobe active may alternatively be edge-aligned with the data and phase shifted by circuitry within a controller-PHY strobe-signal receiver (or other timing circuitry) to achieve the data-eye-midpoint sample timing shown in FIG. 1 (and assumed in discussions of embodiments below).

Figure 2:
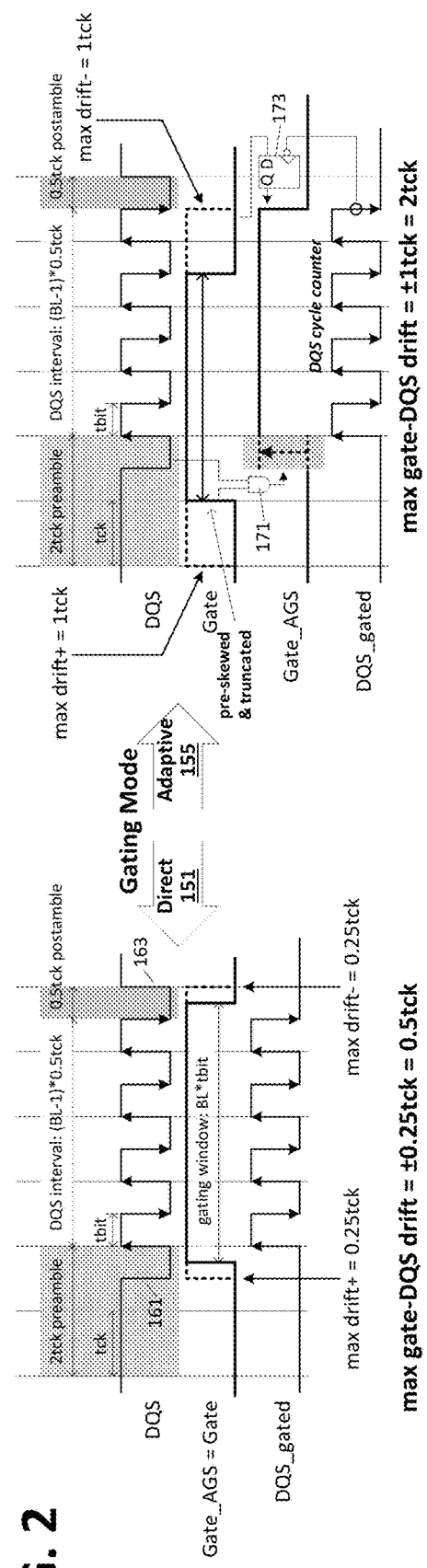

FIG. 2 contrasts the direct and adaptive gating modes within the multi-modal strobe gating logic 110 of FIG. 1. Referring first to the direct gating mode shown at 151 (left side of FIG. 2), a gate signal having an assertion duration (or pulse width) equal to the burst-length, bit-time product (i.e., BL*tbit) is generated within the timing control logic and logically ANDed directly with the incoming DQS signal (e.g., gate signal supplied to synthesizer circuit 121 of FIG. 1 is multiplexed directly to synthesizer output, Gate_AGS and thus effectively supplied directly to logic AND gate 123) to produce a gated DQS signal ("DQS_gated") in which all transitions are active DQS edges (i.e., preamble/overhead transitions gated out). To maximize drift tolerance, the gate signal is initially centered (i.e., through read gate training) around the DQS interval that extends between the first and final active edges of the incoming DQS signal, thus providing tolerance for a 0.5*tbit (or 0.25*tck) drift in either temporal direction. If the gate signal (Gate_AGS) drifts to an assertion point more than 0.5 tck before the first active DQS edge (i.e., early/positive drift or "drift+" by more than 0.25 tck relative to the initial, centered alignment), the gating window will fail to span the DQS interval—instead encompassing preamble falling edge 161 and excluding the final active DQS edge—and thus yield a corrupted DQS_gated signal. Similarly, if Gate_AGS drifts to an assertion point more than 0.5 tck after the final active DQS edge (i.e., late/negative drift or "drift-" by more than 0.25 tck relative to the initial, centered alignment), the gating window will be late relative to the DQS interval (spanning postamble rising edge 163 and excluding the leading DQS active edge) and therefore also yield a corrupted DQS_gated signal. Accordingly, assuming the 2 tck preamble and 0.5 tck postamble intervals shown, the maximum timing skew tolerance (or drift tolerance) between the locally generated gate signal and incoming DQS signal in direct gating mode is constrained to ±0.25 tck, or 0.5 tck in total. In cases of single-tck preambles or abbreviated postambles (in some instances postambles are permitted to shrink to durations as brief as 0.3 tck), direct-gating skew tolerance will be even more tightly constrained.

Turning now to the adaptive gating mode 155 shown in the right-hand side of FIG. 2, the Gate signal supplied to synthesizer 121 of FIG. 1 or "input gate" is used in combination with the incoming DQS signal itself (including the gated version thereof, DQS_gated) to synthesize a Gate_AGS signal that adapts to time-varying skew between the input gate and DQS signals and thereby provide substantially greater input-gate/DQS skew tolerance than in the direct gating mode. More specifically, by pre-skewing the gate signal to an initial alignment centered within the preamble interval (i.e., one tck prior to the leading active DQS edge in this 2 tck toggling-preamble example), and by asserting the Gate_AGS signal based on a combination of a high state of the input gate and a low state of the DQS signal, the Gate_AGS signal is guaranteed to rise at some point during the 0.5 tck interval that precedes the leading DQS active edge, even as the input gate drifts early or late by a full tck relative to its initial preamble-centered alignment. Further, by truncating the input gate duration to match that of the DQS interval (i.e., shortening by 0.5 tck relative to the input gate duration in direct-gating mode) and sampling the input gate on every second falling edge of the gated DQS signal to establish the Gate_AGS deassertion point, the Gate_AGS deassertion is ensured by design to fall at the final active DQS edge (i.e., at the final active DQS_gated edge, which is one gate-delay more latent), even as the input gate drifts early or late by a full tck relative to its initial alignment. Adaptive-gating-mode opening and closing of the gating window is shown conceptually in FIG. 2 by the logical AND combination (171) of the input gate and incoming DQS signal (Gate_AGS assertion, opening the adaptive gating window) and by flop-stage sampling (173) of the input gate in response to the final falling edge of DQS_gated (Gate_AGS deassertion, closing the adaptive gating window), respectively. Overall, the maximum gate-to-DQS drift in this 2 tck preamble example is quadrupled from the ±0.25 tck (0.5 tck) direct-mode drift tolerance to a ±1 tck (2 tck) adaptive-mode drift tolerance. Moreover, the strobe-triggered gate-window closing in adaptive mode (deterministic window closing) renders the adaptive gating window impervious to tolerance-squeezing effect of abbreviated postambles (i.e., initial low state of postamble of the high-park and non-toggling preambles shown in FIG. 1 may be as brief as 0.3 tck, further reducing direct-mode drift tolerance, but not adaptive-mode skew tolerance).

Figure 4B:
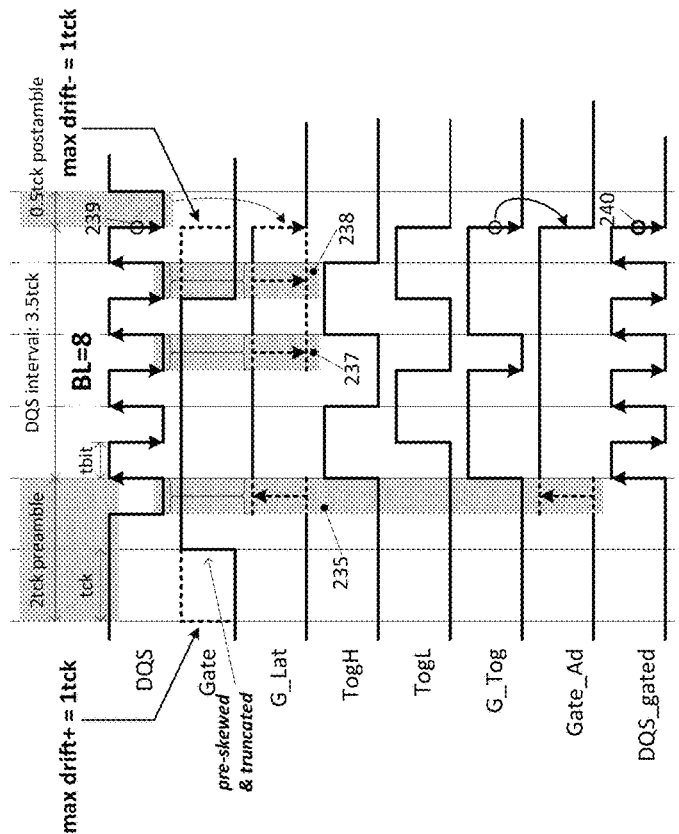
FIGS. 4A and 4B illustrate exemplary operation the adaptive gate synthesizer of FIG. 3 with burst lengths (BL) of four and eight bits, respectively.
Figure 4A:
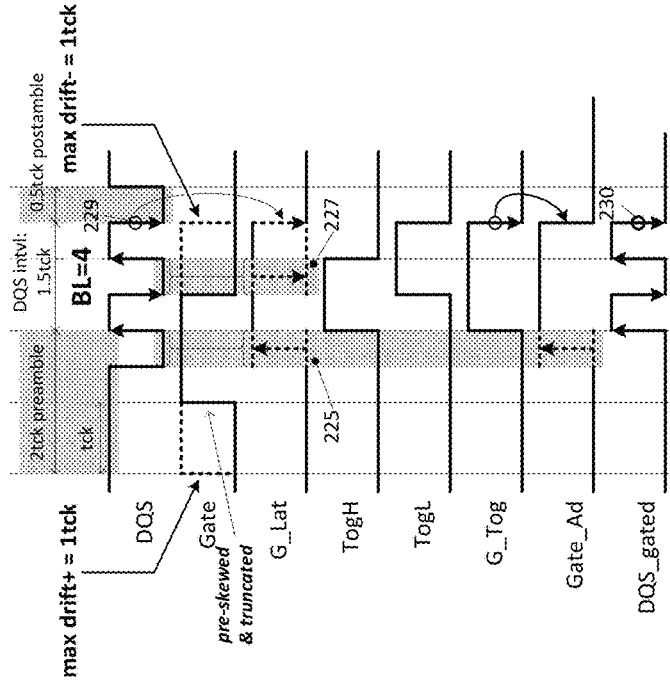

FIG. 3 illustrates a more detailed embodiment of an adaptive gate synthesizer 201, and FIGS. 4A and 4B illustrate exemplary operation thereof with burst lengths of four and eight bits (BL=4, BL=8), respectively. As shown, gate synthesizer 201 includes a latch element 203, flip-flop elements 205, 209 and 211 ("flop stages"), logic OR gate 213 and an optional multiplexer 207, the latter to forward either the input gate signal ("Gate") or adaptive-gate signal ("Gate_Ad") to the synthesizer output as signal Gate_AGS in accordance with a gating-mode signal, G-Mode. As in all embodiments herein, the modal operation of gate synthesizer 201 is optional—the gate-mode signal and multiplexer 207 may be omitted so that gate synthesizer 201 operates exclusively in an adaptive-gating mode (i.e., signals "Gate_AGS" and "Gate_Ad" are one and the same). Though interconnections are not specifically shown, a reset signal input ("Reset") is coupled to reset inputs ("rst") of latch element 203, and flop stages 205, 209 and 211 to enable gate synthesizer 201 to be initialized or restored to a deterministic reset state.

Referring to both FIGS. 3 and 4A, in adaptive gating mode, latch element 203 passes the input gate signal to the latch output ("G_Lat") whenever DQS is low, and holds the latch output state (i.e., holds a steady-state G_Lat output regardless of input gate signal transition) during the high phase of DQS. By this arrangement, the latch output is raised in response to a concurrent high input gate and low DQS phase—an event that first occurs during the low phase of the preamble just prior to the leading active DQS edge. That is, as shown by comparing the input gate and G_Lat waveforms in FIG. 4A, even as the input gate drifts early or late up to the 1-tck skew limit, G_Lat will go high during the preamble low phase—an interval shown at 225 and referred to herein as the preamble "ready state."

Still referring to FIGS. 3 and 4A, the G_Lat output of latch element 203 is coupled to an asynchronous-set input of final flop stage 205, so that the high-going G_Lat signal will force the Gate_Ad output of flop 205 high, thus ensuring that the adaptive gate signal will go high during the preamble ready-state, opening the adaptive gating window sometime during the preamble state (i.e., in the 0.5 tck interval that precedes the first active DQS edge) regardless of ±1 tck drift in the input gate.

Once the adaptive gating window opens (i.e., Gate_Ad/Gate_AGS asserted), active edges of the incoming DQS signal propagate through AND gate 123 to the gated DQS output (DQS_gated) and thus to the triggering inputs of flop-stages 209 and 211. Assuming that flop stages 209 and 211 are initialized to the reset condition, their outputs, TogH and TogL, respectively, will initially be low, so that the TogH feedback to the inverting input of flop stage 209 will cause flop-stage 209 to alternate the state of the TogH output at each active DQS rising edge, starting with a high-going TogH signal at the first rising edge of DQS_gated. The inverted trigger input of flop-stage 211 and data-input connection to the TogH output of flop stage 209 causes the output of flop-stage 211, TogL, to follow that of flop stage 209 with a 0.5 tck delay. Under this arrangement, the ORed combination of the TogH and TogL signals—G_Tog, generated by gate 213—will go high with TogH and then go low in response to every second falling edge of DQS_gated (i.e., when both TogH and TogL are low), causing flop-stage 205 to sample the state of the input gate signal at those instants, driving Gate_Ad and Gate_AGS low if the input gate is low. In the BL=4 example, the truncated input gate ensures that, regardless of input gate timing relative to incoming DQS (within the ±tck drift tolerance range shown), the input gate and G_Lat signals will both be low at the second/final falling edge of DQS_gated (and thus when G_Tog goes low) so that flop-stage 205 will deterministically drive Gate_Ad low immediately after the final DQS active edge, closing the gating window promptly after the last DQS edge is gated through and before the ensuing postamble active edge. With regard to the latch output (G_Lat), in particular, any input-gate/DQS timing relation in which the input-gate is low or goes low during the 0.5 tck interval following the first active falling edge (i.e. shown at 227 in FIG. 4A) will cause G_Lat to go low. In the extreme late timing scenario (input gate late by more than 0.5 tck and less than 1 tck), the input gate will remain high during the low DQS phase that follows the first active falling edge (shaded time interval 227), but will be low at the second DQS falling edge (229), ensuring that G_Lat will drop prior to the final DQS_gated falling edge 230 in all skew conditions within the 2 tck skew-tolerance range.

FIG. 4B illustrates an exemplary operation of the FIG. 3 synthesizer embodiment under an 8-bit burst length setting (BL=8). Again, the input gate is pre-skewed relative to the incoming DQS signal (i.e., aligned at the preamble midpoint) and truncated to match the DQS interval (i.e., tbit*(BL−1)). Consequently, over the permissible input-gate drift range (2 tck less incremental gate delays), the input gate signal is ensured to go high and remain high during the ready state of the DQS preamble (interval 235), and ensured not to go low until after the second DQS_gated falling edge. Moreover, the latch output is ensured to go low during either of the final two low DQS phases 237 or 238 that precede the final active DQS edge 239, or at the final DQS active edge 239 (start of the post amble) so that low-going G_Tog signal is guaranteed by design to sample the low input-gate state and thus drive Gate_Ad low a deterministic time immediately following the final active DQS_gated edge 240. This operation holds for all factor-4 burst lengths (i.e., burst lengths evenly divisible by four and thus BL=4, 8, 12, 16, . . . , 32, 36, etc.). For all those burst-length settings, the input-gate will go low during the 2 tck interval bounded by the final and penultimate G_Tog falling edges, thus ensuring that the final G_Tog falling edge will sample a low input gate signal while G_Lat is low and thus close the adaptive gating window immediately after the final active DQS edge has been gated through AND gate 123.

Reflecting on FIGS. 3, 4A and 4B, a minimum of four DQS_gated edges (two rising, two falling) are required to close the gating window (i.e., generate a falling G_Tog edge while input-gate and G_Lat are low), meaning that the FIG. 3 synthesizer circuit is adapted to factor-4 burst lengths ("BL4+") and thus accommodates a minimum burst length of four (BL=4). To accommodate 2-bit memory component read-data bursts (BL=2), the gate synthesizer circuit may be implemented as shown in FIG. 5—an embodiment (251) in which flop stages 209 and 211 and OR gate 213 of the FIG. 3 gate synthesizer are omitted, and the gated DQS signal is fed back to the inverting trigger input of flop stage 205. As in the FIG. 3 embodiment, a reset signal is supplied to elements 203 and 205 (interconnections are not specifically shown) to initialize and/or restore gate synthesizer 251 to a deterministic reset state.

FIG. 6A contrasts direct and adaptive gating modes within gate synthesizer circuit 251 of FIG. 5. In direct gating mode 271, synthesizer 251 operates in the same manner as the BL=4+ embodiment described in reference to FIGS. 3 and 4A, with the gate-mode signal (G-Mode) passing the input gate signal directly to the Gate_AGS output (and with input gate having a duration equal to BL*tbit or, in this BL=2 case, 1 tck). In adaptive gating mode 275, gate synthesizer 251 operates generally as discussed in reference to FIGS. 3 and 4B, with the input gate signal being pre-skewed for leading-edge alignment with the center point of the preamble interval (i.e., advanced by 0.5 tck relative to the initial active DQS edge in this 1 tck, toggling preamble example) and truncated by a bit time (i.e., input gate pulse width=0.5 tck*(BL−1)=0.5 tck). As before, the output of latch element 203, G_Lat, tracks the input gate state during the low phase of the DQS meaning that G_Lat and thus Gate_Ad/Gate_AGS will go high during the 0.5 tck preamble ready state 277 and thus prior to the leading active DQS edge. G_Lat will fall at the second and final (falling) DQS active edge 279 and thus be low when that final active edge propagates through AND gate 123 (i.e., DQS_gated edge 280) to trigger a G_Lat sampling within flop stage 205—a sampling operation that will cause the low G_Lat state to propagate to Gate_Ad and Gate_AGS and thereby close the gating window. Overall, the maximum gate-to-DQS drift is doubled from the ±0.25 tck (0.5 tck) direct-mode drift tolerance to ±0.5 tck (1 tck) adaptive-mode drift tolerance. Moreover, the strobe-triggered window closing in adaptive mode (deterministic window closing) renders the adaptive gating window impervious to shortened-postamble tolerance loss.

FIG. 6B illustrates an exemplary adaptive-gating-mode operation of the FIG. 5 synthesizer with a four-bit burst length (BL=4). As before, the input gate is pre-skewed to align the gate rising edge with the preamble center point, and truncated (i.e., by 0.5 tck relative to a direct-mode equivalent) to 1.5 tck (0.5 tck*(BL−1)). The output of latch 203 rises during the preamble ready-state (low interval 287 that precedes the initial DQS active edge), so that Gate_Ad/Gate_AGS also go high to open the gating window. Because the input gate is ensured (by drift tolerance design) to be high during the first active falling DQS edge and low during the second active falling DQS edge, the latch output remains high at the first falling edge of DQS_gated (288), and then goes low at the second active falling DQS edge—just before the second falling edge of DQS_gated (290). Accordingly, the second falling edge of DQS_gated 290 will trigger a sampling of the low input gate state and (because G_Lat will be low by that time) thereby drive Gate_Ad and Gate_AGS low, deterministically closing the gating window immediately after the second active falling DQS edge propagates through AND gate 123 (and without regard to postamble abbreviation). As in the adaptive-gating-mode BL=2 case shown in FIG. 6A, a net drift tolerance of 1 tck (±0.5 tck) is achieved.

Reflecting on the adaptive gating windows implemented within the synthesizer circuit embodiments of FIGS. 3 and 5, the total drift tolerance is constrained at least partly by the preamble duration For all preamble types, however (including all preamble types shown in FIG. 1), gate-to-DQS skew tolerance is increased by at least 100% over direct-mode gating, a tolerance that increases to at least 400% for longer preambles.

FIGS. 7 and 8 illustrate an embodiment of a gate training circuit and exemplary gate-training sequence that may be used to achieve the initial input-gate phase in the direct and adaptive gating modes discussed above. Starting with FIG. 7, an incoming strobe signal (received via external-interconnect pad 295 and conditioned within amplifier/level-shifting circuit 297) is supplied to strobe gating logic 110 as discussed above and is supplied also to a gate training logic circuit 303 within timing controller 301—a circuit as shown generally at 107 in FIG. 1 and which outputs the above-described gate signal to the strobe gating logic.

Gate training logic 303 also receives, from other circuit elements within timing controller 301 or elsewhere within the controller IC, a data-rate clock signal (dclk) that establishes or is phase aligned with the internal clock domain of the controller IC; an unprocessed (raw) gate signal, "R_Gate," having a burst-length controlled assertion duration (e.g., BL*tbit); and, where multiple preamble types having different durations are supported, a preamble-duration value, PrD. During controller initialization (and occasionally thereafter in some embodiments) a timing calibration operation is executed within gate training logic 303 to establish a desired initial phase alignment between the gate signal (Gate) and the incoming DQS signal, aligning the leading edge of Gate with the midpoint of the DQS preamble in adaptive gating implementations or operating modes, and centering Gate with respect to the DQS active edges in direct gating modes.

Referring to detail view 310 of FIG. 7, an exemplary implementation of gate training logic 303 includes a digitally-controlled delay/pre-skew circuit 323, gate-signal truncation circuit 329, optional gating-mode multiplexer 331, phase detector 335 and delay control register 337. After gate training has been completed (a timing calibration operation commenced in response to assertion of a gate-training signal, GT, as discussed below in reference to FIGS. 8 and 9), the incoming dclk and R_Gate signals propagate through delay/pre-skew circuit 323 to yield the tck signal discussed above in reference to FIGS. 1-6B and a delayed/pre-skewed gate signal (D_Gate), respectively, both in nominal phase alignment with the timing domain established by the incoming DQS signal. The delayed gate and tck signals are provided to truncation circuit 329 which, in the exemplary implementation shown at 350, outputs a delayed/truncated gate signal (DT_Gate) that is phase delayed relative to D_Gate by 1 tck and temporally truncated (shortened) relative to D_Gate by 0.5*tck (or 1-tbit). Where both direct and adaptive gating modes are supported, the DT_Gate and D_Gate signals are supplied to gating-mode multiplexer 331 which responds to a gate-mode signal (G-Mode) by passing either D_Gate or DT_Gate to the gate-training-logic output as the finalized gate signal (Gate) and thus the "input gate signal" supplied to strobe gating logic 110. As in all embodiments, direct gating mode may be unsupported, in which case multiplexer 331 may be omitted and DT_Gate output directly as the finalized gate signal.

Still referring to detail view 310 of FIG. 7, where both direct and adaptive gating modes are supported, the gate-mode signal is supplied to delay/pre-skew circuit 323 to control the R_Gate-to-D_Gate delay, effecting a D_Gate signal that is centered with respect to active DQS edges in direct-gating mode (e.g., backing off the leading edge of D_Gate from the first active DQS edge by a 0.25*tck interval or less as explained above) and, in adaptive-gating mode, implementing a DT_Gate phase that precedes the first active DQS edge by an interval nominally equal to half the preamble duration. In embodiments that support preambles of various durations, the preamble duration setting, PrD (e.g., programmed within a register of the timing controller or other logic within the host integrated circuit), is supplied to delay/pre-skew circuit 323 to control the DT_Gate pre-skew relative to DQS—e.g., establishing either a 0.5 tck (1-tbit) or 1 tck (2-tbit) pre-skew for the exemplary 1 tck and 2 tck preambles shown in FIG. 1, respectively.

Prior to initial gate training in an adaptive-gating mode (i.e., gate-training signal, GT, yet to be asserted), the dclk and tck signals will be phase aligned and the DT_Gate signal will have an arbitrary phase offset (skew) relative to the desired DQS alignment in accordance with the skew between the tck and DQS timing domains. This initial "untrained gate" condition is shown at 381 of the exemplary timing diagram in FIG. 9. As GT is deasserted at this point, delay/pre-skew circuit will implement a PrD/2 pre-skew to the D_Gate and DT_Gate signals (i.e., "PrD/2 pre-skew enabled"), effecting an R_Gate and D_Gate alignment as shown, with the DT_Gate being delayed relative to D_Gate by 1 tck.

Referring now to FIGS. 7, 8 and 9, gate training is commenced by assertion of the GT signal as shown at 371 of FIG. 8, a signal assertion that disables the PrD/2 pre-skew within delay/pre-skew circuit 323 to yield the untrained-gate/GT-asserted scenario shown at 387 of FIG. 9. That is, upon GT signal assertion and prior to iterative phase adjustment, D_Gate is phase-delayed by PrD/2 (0.5 tck in this 1 tck preamble example) relative to R_Gate and DT_Gate is correspondingly phase delayed by PrD/2+1 tck relative to R_Gate (i.e., DT_Gate being maintained with a fixed 1 tck delay relative to D_Gate in the exemplary implementation shown at 350 of FIG. 7). At 373 of FIG. 8, the output of phase detector 335 (which outputs phase+ or phase− signals to register 337 according to which of the DQS and Gate signal edges leads/lags the other) is enabled to iteratively adjust the delay setting applied to delay/pre-skew circuit 323 and thereby incrementally shift the Gate signal phase (and thus the DT_Gate phase) into alignment with the initial active DQS edge to achieve the trained-gate condition shown at 393 of FIG. 9 (i.e., tck and DQS timing domains nominally aligned). Finally, at 375 of FIG. 8, the gate-training signal (GT) is deasserted to re-enable the PrD/2 pre-skew and thereby align the leading edge of Gate (and thus DT_Gate) with the preamble midpoint as shown at 399 of FIG. 9. Overall, the exemplary gate-training sequence shown in FIGS. 8 and 9 yields the pre-skewed and truncated Gate signal discussed in the adaptive-gating mode examples above (i.e., DT_Gate and thus Gate phase aligned with the temporal midpoint of the preamble and having a duration truncated by 0.5 tck). Various other gate-training/timing calibration operations may be executed in alternative embodiments, including periodic gate-training/timing calibrations in which prior delay settings are cleared prior to re-calibration or applied as the gate-training starting phase.

FIG. 10 illustrates an alternative gate synthesizer circuit embodiment 401 that may be programmably configured to implement either of the circuit configurations shown in FIGS. 3 and 5 and thus support any common even-bit-count burst length (BL=2, 4, 8, . . . ) with 1 tck or 2 tck drift tolerance. In general, gate synthesizer 401 is implemented exactly as in the embodiment of FIG. 3, except that an additional gate-mode-controlled multiplexer 405 is provided to select either DQS_gated or G_Tog to drive the active-low trigger input of flop stage 205. In the former case, flop stages 209, 211 and OR gate 213 are effectively bypassed to yield the operational configuration shown in FIG. 5, and in the latter case, the circuit operation matches that of FIG. 3, except that G_Tog passes to the flop 205 trigger input via multiplexer 405. In the particular embodiment shown, a two-bit gate-mode signal is provided and encoded as shown at 420 to select between either direct gating mode (passing the input gate signal through multiplexer 405) or one of the two burst-length-specific adaptive-gating modes. As in all other embodiments discussed herein, direct operation mode may be unsupported (i.e., synthesizer operates exclusively in adaptive gating mode) so that multiplexer 207 may be omitted and mode signal bit-count may be reduced. Also, as with all other synthesizer circuits discussed herein, an incoming reset signal is supplied to reset inputs of state-capable elements (i.e., latch element 203 and flop stages 205, 209 and 211) through interconnections not shown, and component elements of the synthesizer circuit that are unused in a given gating mode (or during a given operation) may be disabled (unclocked, decoupled from power rails, etc.) to conserve power. For example, in the BL=2 adaptive gating mode, flop stages 209 and 211 may be disabled.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the, signaling characteristics (e.g., preamble types), component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line, and each of the single signal lines can alternatively be buses. Signals and signaling links, however shown or described, can be single-ended or differential. Signals shown as having active-high assertion or "true" states, may have opposite assertion states in alternative implementations. A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A method of operation within an integrated-circuit component having a data input to receive a sequence of data values and a timing input, the method comprising:
   receiving, via the timing input, a first timing signal having a sequence of data-timing transitions corresponding to the sequence of data values;
   asserting a control signal prior to an initial one of the data-timing transitions and deasserting the control signal prior to a trailing one of the data-timing transitions;
   asserting a gating signal in response to detecting a predetermined state of the first timing signal during assertion of the control signal; and
   deasserting the gating signal after deassertion of the control signal and in response to the trailing one of the data-timing transitions.

2. The method of claim 1 wherein asserting the control signal prior to the initial one of the data-timing transitions and deasserting the control signal prior to the trailing one of the data-timing transitions comprises generating, as the control signal, a control pulse that commences prior to the initial one of the data-timing transitions and has a pulse width nominally equal to a time period between the initial one of the data-timing transitions and the trailing one of the data-timing transitions.

3. The method of claim 1 wherein asserting and deasserting the control signal comprises asserting and deasserting the control signal synchronously with respect to a clock signal having a time-varying phase offset relative to the first timing signal.

4. The method of claim 3 wherein the time-varying phase offset ranges between a maximum phase offset and a minimum phase offset that are separated by twice the period of the clock signal.

5. The method of claim 4 wherein the time-varying phase offset ranges non-inclusively between the maximum and minimum phase offsets.

6. The method of claim 1 wherein the first timing signal is characterized by a preamble having a predetermined duration, and wherein asserting the control signal prior to the initial one of the data-timing transitions comprises asserting the control signal at a nominal midpoint of the predetermined duration of the preamble.

7. The method of claim 6 wherein asserting the control signal at a nominal midpoint of the predetermined duration of the preamble comprises asserting the control signal in response to a transition of a clock signal having a time-varying phase offset relative to the first timing signal such that assertion of the control signal at the nominal midpoint of the predetermined duration of the preamble may result in assertion of the control signal at any time after commencement of the preamble and prior to conclusion of the preamble.

8. The method of claim 1 wherein deasserting the control signal comprises deasserting the control signal in response to a transition of a clock signal having a time-varying phase offset relative to the first timing signal such that the control signal is deasserted, for at least one permissible sub-range of the time-varying phase offset, prior to one of the data-timing transitions that precedes the trailing one of the data-timing transitions.

9. The method of claim 8 wherein the one of the data-timing transitions that precedes the trailing one of the data-timing transitions comprises a transition of the first timing signal from a first voltage level to a second voltage level, and wherein deasserting the gating signal after deassertion of the control signal and in response to the trailing one of the data-timing transitions comprises deasserting the gating signal in response to a transition of the first timing signal from the second voltage level to the first voltage level that occurs after deassertion of the control signal such that, when the control signal is deasserted while a phase difference between the clock signal and the first timing signal is within the at least one permissible sub-range of the time-varying phase offset, the gating signal remains asserted before and after the one of the data-timing transitions that precedes the trailing one of the data-timing transitions.

10. The method of claim 1 wherein the first timing signal is characterized by a preamble transition that precedes the data-timing transitions and a postamble transition that follows the data-timing transitions, the method further comprising logically combining the first timing signal and the gating signal to generate a second timing signal that (i) lacks transitions corresponding to the preamble and postamble transitions of the first timing signal and (ii) includes a sequence of data-timing transitions that correspond to the data-timing transitions of the first timing signal.

11. An integrated-circuit component comprising:
a data input to receive a sequence of data values;
a timing input to receive a first timing signal having a sequence of data-timing transitions corresponding to the sequence of data values; and
gating circuitry to:
assert a control signal prior to an initial one of the data-timing transitions,
deassert the control signal prior to a trailing one of the data-timing transitions,
assert a gating signal in response to detecting a predetermined state of the first timing signal during assertion of the control signal, and
deassert the gating signal after deassertion of the control signal and in response to the trailing one of the data-timing transitions.

12. The integrated-circuit component of claim 11 wherein the gating circuitry to assert the control signal prior to the initial one of the data-timing transitions and to deassert the control signal prior to the trailing one of the data-timing transitions comprises circuitry to generate, as the control signal, a control pulse that commences prior to the initial one of the data-timing transitions and has a pulse width nominally equal to a time period between the initial one of the data-timing transitions and the trailing one of the data-timing transitions.

13. The integrated-circuit component of claim 11 wherein the gating circuitry to assert and deassert the control signal comprises circuitry to assert and deassert the control signal synchronously with respect to a clock signal having a time-varying phase offset relative to the first timing signal.

14. The integrated-circuit component of claim 13 wherein the time-varying phase offset ranges between a maximum permissible phase offset and a minimum permissible phase offset that are separated by twice the period of the clock signal.

15. The integrated-circuit component of claim 11 wherein the first timing signal is characterized by a preamble having a predetermined duration, and wherein the gating circuitry to assert the control signal prior to the initial one of the data-timing transitions comprises circuitry to assert the control signal at a nominal midpoint of the predetermined duration of the preamble.

16. The integrated-circuit component of claim 15 wherein the circuitry to assert the control signal at the nominal midpoint of the predetermined duration of the preamble comprises circuitry to assert the control signal in response to a transition of a clock signal having a time-varying phase offset relative to the first timing signal such that assertion of the control signal at the nominal midpoint of the predetermined duration of the preamble may result in assertion of the control signal at any time after commencement of the preamble and prior to conclusion of the preamble.

17. The integrated-circuit component of claim 11 wherein the gating circuitry to deassert the control signal comprises circuitry to deassert the control signal in response to a transition of a clock signal having a time-varying phase offset relative to the first timing signal such that the control signal is deasserted, for at least one permissible sub-range of the time-varying phase offset, prior to one of the data-timing transitions that precedes the trailing one of the data-timing transitions.

18. The integrated-circuit component of claim 17 wherein the one of the data-timing transitions that precedes the trailing one of the data-timing transitions comprises a transition of the first timing signal from a first voltage level to a second voltage level, and wherein the gating circuitry to deassert the gating signal after deassertion of the control signal and in response to the trailing one of the data-timing transitions comprises circuitry to deassert the gating signal in response to a transition of the first timing signal from the second voltage level to the first voltage level that occurs after deassertion of the control signal such that, when the control signal is deasserted while a phase difference between the clock signal and the first timing signal is within the at least one permissible sub-range of the time-varying phase offset, the gating signal remains asserted before and after the one of the data-timing transitions that precedes the trailing one of the data-timing transitions.

19. The integrated-circuit component of claim 11 wherein the first timing signal is characterized by a preamble transition that precedes the data-timing transitions and a postamble transition that follows the data-timing transitions, the integrated-circuit component further comprising logic circuitry to logically combine the first timing signal and the gating signal to generate a second timing signal that (i) lacks transitions corresponding to the preamble and postamble transitions of the first timing signal and (ii) includes a sequence of data-timing transitions that correspond to the data-timing transitions of the first timing signal.

20. An integrated-circuit component comprising:
a data input to receive a sequence of data values;
a timing input to receive a first timing signal having a sequence of data-timing transitions corresponding to the sequence of data values; and
means for:
asserting a control signal prior to an initial one of the data-timing transitions,
deasserting the control signal prior to a trailing one of the data-timing transitions,
asserting a gating signal in response to detecting a predetermined state of the first timing signal during assertion of the control signal, and deasserting the gating signal after deassertion of the control signal and in response to the trailing one of the data-timing transitions.

\* \* \* \* \*